(12) United States Patent
Leyder et al.

(10) Patent No.: US 10,036,832 B2
(45) Date of Patent: Jul. 31, 2018

(54) MULTILAYER COMPONENT FOR THE ENCAPSULATION OF A SENSITIVE ELEMENT

(75) Inventors: Charles Leyder, Paris (FR); Claire Thoumazet, Paris (FR); Martin Python, Vesin (CH)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 83 days.

(21) Appl. No.: 13/441,766

(22) Filed: Apr. 6, 2012

(65) Prior Publication Data

US 2012/0258295 A1    Oct. 11, 2012

(30) Foreign Application Priority Data

Apr. 8, 2011 (FR) ...................... 11 53113

(51) Int. Cl.
*B32B 7/02* (2006.01)
*B32B 15/08* (2006.01)
(Continued)

(52) U.S. Cl.
CPC ............. *G02B 1/10* (2013.01); *C03C 17/42* (2013.01); *H01L 51/0097* (2013.01);
(Continued)

(58) Field of Classification Search
CPC  B32B 27/08; B32B 7/02; B32B 27/32; G11B 5/716; C23C 14/34; C23C 14/3407; C23C 14/35; C23C 14/54; G03C 1/74; B05C 9/06; B05C 5/007; B82Y 30/00

USPC ...... 428/212, 480, 412, 423.1, 474.4, 473.5, 428/522, 421, 422, 457, 702, 698, 336, 428/420; 427/255.28, 569, 402; 204/192.1

See application file for complete search history.

(56) References Cited

U.S. PATENT DOCUMENTS

| | | |
|---|---|---|
| 5,172,269 A | 12/1992 | Ogura et al. |
| 5,234,748 A | 8/1993 | Demiryont et al. |

(Continued)

FOREIGN PATENT DOCUMENTS

| | | |
|---|---|---|
| CA | 2746559 A1 | 6/2010 |
| CN | 1416299 A | 5/2003 |

(Continued)

OTHER PUBLICATIONS

Jin-Seong Park et al., "Thin film encapsulation for flexible AmOLeD: a revew," Semiconductor Science and Technology, vol. 26, No. 3, Mar. 1, 2011, p. 034001, XP55006840.
(Continued)

*Primary Examiner* — Tahseen N Khan
(74) *Attorney, Agent, or Firm* — Abel Law Group, LLP; Thomas Osborn

(57) ABSTRACT

This multilayer component (11) for encapsulating an element (12) which is sensitive to air and/or moisture comprises an organic polymer layer (1) and at least one barrier stack (2). The barrier stack (2) comprises at least three successive thin layers (21-23) having alternately lower and higher degrees of crystallinity, the ratio of the degree of crystallinity of a layer of higher degree of crystallinity to the degree of crystallinity of a layer of lower degree of crystallinity being greater than or equal to 1.1.

17 Claims, 3 Drawing Sheets

(51) Int. Cl.

| | | |
|---|---|---|
| *C23C 14/35* | (2006.01) | |
| *C23C 16/50* | (2006.01) | |
| *B05D 1/36* | (2006.01) | |
| *G02B 1/10* | (2015.01) | |
| *C03C 17/42* | (2006.01) | |
| *H01L 51/00* | (2006.01) | |
| *H01L 51/52* | (2006.01) | |
| *G02B 1/16* | (2015.01) | |
| *G02B 1/11* | (2015.01) | |
| *H01L 27/30* | (2006.01) | |
| *H01L 27/32* | (2006.01) | |

(52) U.S. Cl.
CPC ............ *H01L 51/5256* (2013.01); *G02B 1/11* (2013.01); *G02B 1/16* (2015.01); *H01L 27/301* (2013.01); *H01L 27/32* (2013.01); *H01L 51/5281* (2013.01); *H01L 2251/5338* (2013.01); *Y02E 10/549* (2013.01); *Y10T 428/24942* (2015.01); *Y10T 428/265* (2015.01); *Y10T 428/3154* (2015.04); *Y10T 428/31507* (2015.04); *Y10T 428/31536* (2015.04); *Y10T 428/31544* (2015.04); *Y10T 428/31551* (2015.04); *Y10T 428/31678* (2015.04); *Y10T 428/31721* (2015.04); *Y10T 428/31725* (2015.04); *Y10T 428/31786* (2015.04); *Y10T 428/31935* (2015.04)

(56) References Cited

U.S. PATENT DOCUMENTS

| | | | |
|---|---|---|---|
| 5,254,904 | A | 10/1993 | Van De Leest et al. |
| 5,853,478 | A | 12/1998 | Yonehara et al. |
| 6,068,914 | A | 5/2000 | Boire et al. |
| 6,268,695 | B1 | 7/2001 | Affinito |
| 6,284,382 | B1 | 9/2001 | Ishikawa et al. |
| 6,570,325 | B2* | 5/2003 | Graff .................. H01L 51/5256 313/502 |
| 6,573,652 | B1 | 6/2003 | Graff et al. |
| 6,574,039 | B1 | 6/2003 | Murata et al. |
| 6,589,658 | B1 | 7/2003 | Stachowiak |
| 6,842,288 | B1 | 1/2005 | Liu et al. |
| 6,896,979 | B2 | 5/2005 | Sawai et al. |
| 7,405,005 | B2 | 7/2008 | Watanabe |
| 7,504,332 | B2 | 3/2009 | Kyung et al. |
| 7,880,966 | B2 | 2/2011 | Suzuki |
| 8,133,577 | B2 | 3/2012 | Kuramachi et al. |
| 8,586,189 | B2 | 11/2013 | Ito et al. |
| 8,766,280 | B2 | 7/2014 | Thoumazet |
| 9,246,131 | B2 | 1/2016 | Thoumazet et al. |
| 2002/0090521 | A1 | 7/2002 | Nakajima et al. |
| 2003/0067266 | A1 | 4/2003 | Kim et al. |
| 2003/0104753 | A1 | 6/2003 | Graff et al. |
| 2003/0127974 | A1 | 7/2003 | Miyazawa |
| 2003/0186064 | A1* | 10/2003 | Murata et al. .................. 428/432 |
| 2004/0018362 | A1 | 1/2004 | Nakajima et al. |
| 2004/0076835 | A1 | 4/2004 | Watanabe |
| 2004/0160178 | A1 | 8/2004 | Qui et al. |
| 2004/0229051 | A1* | 11/2004 | Schaepkens .......... C23C 14/022 428/447 |
| 2004/0229394 | A1 | 11/2004 | Yamada et al. |
| 2005/0012248 | A1 | 1/2005 | Yi et al. |
| 2005/0207016 | A1 | 9/2005 | Ando |
| 2006/0159892 | A1 | 7/2006 | Mutsaers |
| 2007/0116966 | A1 | 5/2007 | Mellott et al. |
| 2007/0155137 | A1 | 7/2007 | Joshi et al. |
| 2007/0212498 | A1 | 9/2007 | Fukushige et al. |
| 2008/0026198 | A1 | 1/2008 | Komada et al. |
| 2008/0049431 | A1 | 2/2008 | Boek et al. |
| 2008/0138539 | A1 | 6/2008 | Breitung et al. |
| 2008/0213513 | A1 | 9/2008 | Kameshima et al. |
| 2008/0265245 | A1 | 10/2008 | Gotoh et al. |
| 2008/0284331 | A1 | 11/2008 | Hayashi |
| 2009/0072230 | A1 | 3/2009 | Ito et al. |
| 2009/0084963 | A1 | 4/2009 | Kost |
| 2009/0087668 | A1 | 4/2009 | Noro et al. |
| 2009/0095346 | A1 | 4/2009 | Hurley et al. |
| 2009/0096106 | A1 | 4/2009 | Vrtis et al. |
| 2009/0110896 | A1 | 4/2009 | Kuramachi et al. |
| 2009/0128916 | A1 | 5/2009 | Noro |
| 2009/0199901 | A1 | 8/2009 | Trassl et al. |
| 2009/0258237 | A1* | 10/2009 | Choi et al. .................... 428/447 |
| 2009/0305062 | A1 | 12/2009 | Choi et al. |
| 2010/0089636 | A1 | 4/2010 | Kumar et al. |
| 2010/0196679 | A1 | 8/2010 | Morishima |
| 2010/0208349 | A1 | 8/2010 | Beer et al. |
| 2010/0215929 | A1 | 8/2010 | Sang-Joon et al. |
| 2010/0245991 | A1 | 9/2010 | Ishihara et al. |
| 2010/0330748 | A1 | 12/2010 | Xi et al. |
| 2011/0049730 | A1 | 3/2011 | Schmid et al. |
| 2011/0085233 | A1 | 4/2011 | Furusato |
| 2012/0107387 | A1 | 5/2012 | Ochiai et al. |
| 2012/0228641 | A1 | 9/2012 | Thoumazet et al. |
| 2012/0228668 | A1 | 9/2012 | Thoumazet et al. |
| 2012/0258294 | A1 | 10/2012 | Leyder et al. |

FOREIGN PATENT DOCUMENTS

| | | |
|---|---|---|
| CN | 1426605 A | 6/2003 |
| CN | 1806350 A | 7/2006 |
| CN | 101765870 A | 6/2010 |
| CN | 101933173 A | 12/2010 |
| CN | 102714279 A | 10/2012 |
| CN | 102714280 A | 10/2012 |
| DE | 10 2008 031405 A1 | 1/2010 |
| EP | 0502790 B1 | 12/1994 |
| EP | 1 329 307 A1 | 7/2003 |
| EP | 1892777 A2 | 2/2008 |
| EP | 2476147 A1 | 7/2012 |
| EP | 2476148 A1 | 7/2012 |
| FR | 2 858 975 A1 | 2/2005 |
| FR | 2 949 775 A1 | 3/2011 |
| FR | 2 949 776 A1 | 3/2011 |
| JP | 2000211053 A | 8/2000 |
| JP | 2002260848 A | 9/2002 |
| JP | 2003264062 A | 9/2003 |
| JP | 2003532260 A | 10/2003 |
| JP | 2004022281 A | 1/2004 |
| JP | 2004174713 A | 6/2004 |
| JP | 2004198590 A | 7/2004 |
| JP | 2004345223 A | 12/2004 |
| JP | 2005510757 A | 4/2005 |
| JP | 2006106239 A | 4/2006 |
| JP | 2006338947 A | 12/2006 |
| JP | 2007017668 A | 1/2007 |
| JP | 2007038529 A | 2/2007 |
| JP | 2007090702 A | 4/2007 |
| JP | 2007099931 A | 4/2007 |
| JP | 2007265841 A | 10/2007 |
| JP | 2007277631 A | 10/2007 |
| JP | 2009073090 A | 4/2009 |
| JP | 2009090634 A | 4/2009 |
| JP | 2009117817 A | 5/2009 |
| JP | 2009133000 A | 6/2009 |
| JP | 2010105321 A | 5/2010 |
| JP | 2010237415 A | 10/2010 |
| KR | 1020040106431 A | 12/2004 |
| KR | 1020110000818 A | 1/2011 |
| MX | 2012002892 A | 6/2012 |
| WO | 200137006 A1 | 5/2001 |
| WO | 2003040782 A1 | 5/2003 |
| WO | 2005045948 A2 | 5/2005 |
| WO | 2005081333 A2 | 9/2005 |
| WO | 2008011919 A1 | 1/2008 |
| WO | 2008054542 A2 | 5/2008 |
| WO | 2009098793 A | 8/2009 |
| WO | 2010077412 A1 | 7/2010 |
| WO | 2010078233 A2 | 7/2010 |
| WO | 2010108894 A1 | 9/2010 |
| WO | 2011004834 A1 | 1/2011 |
| WO | 2011029786 A1 | 3/2011 |
| WO | 2011029787 A1 | 3/2011 |

(56) References Cited

FOREIGN PATENT DOCUMENTS

| WO | WO 2011029786 A1 * | 3/2011 |
|---|---|---|
| WO | WO 2011029787 A1 * | 3/2011 |
| WO | 2012139056 A2 | 10/2012 |
| WO | 2012139057 A2 | 10/2012 |

OTHER PUBLICATIONS

Zhengxia Chen et al., "Molecular dynamics simulation of water diffusion inside an amorphous polyacrylate latex film," Journal of Polymer Science, Part B: Polymer Phsics, vol. 45, No. 8, Apr. 15, 2007, pp. 884-891, XP55010766.
E. H. H. Jamieson et al., "Structure and oxygen-barrier properties of metallized polymer film," Journal of Materials Science, vol. 18, No. 1, Jan. 1, 1983, pp. 64-80, XP55010762.
Myeon-Cheon Choi et al., "Polymers for flexible displays: From material selection to device applications," Progress in Polymer Science, vol. 33, Feb. 4, 2008, pp. 581-630, XP002609297.
Kuo M. L., et al., "Realization of a near-perfect anitreflection coating for silicon solar energy utilization," Optics Letters, vol. 33, No. 21, Nov. 1, 2008, pp. 2527-2529, XP002578609.
H. Lifka, et al., "50.3: Thin Film Encapuslation of Oled Displays with a NONON Stack," Philips Research Laboratories Eindhoven, Slo 04 Digest, pp. 1384-1387, 2004.
International Search Report from Application No. PCT/EP2010/062998, dated Nov. 23, 2010, 5 pgs.
U.S. Appl. No: 13/395,406, filed Mar. 9, 2012, Inventors: Claire Thoumazet et al.
International Search Report from Application No. PCT/EP2010/062999, dated Nov. 30, 2010, 4 pgs.
U.S. Appl. No. 13/395,412, filed Mar. 9, 2012, Inventors: Claire Thoumazet et al.
French Search Report from Application No. 1153114, dated Oct. 31, 2011, 8 pgs.
French Search Report from Application No. 1153113, dated Oct. 31, 2011, 8 pgs.
U.S. Appl. No. 13/441,760, filed Apr. 6, 2012, Inventors: Charles Leyder et al.
C. Ricciardi, et al., "Amorphous Silicon Nitride: a suitable alloy for optical multilayered structures," Journal of Non-Crystalline Solids, vol. 3.52, Mar. 31, 2006, pp. 1294-1297, XP002577247.
R. Vernhes et al., "Pulsed Radio Frequency Plasma Deposition of a-SiNx:H Alloys: Film Applications," Journal of Applied Physics, Americal Institute of Physics, New York, US LNKD-DOI:10.1063/1.2349565, vol. 100, No. 6, Sep. 28, 2006, XP012090005.
R. Vernhes et al., "Single-Material Inhomogeneous Optical Filters Based on Microstructural Gradients in Plasma-Deposited Silicon Nitride," Applied Opitcs, vol. 43, No. 1, Jan. 1, 2004, pp. 97-103, XP002577246.
W. Wolke et al., "Sin:H Anti-Reflection Coatings for C-XI Solar Cells by Large Scale Inline Sputtering," Proceedings of the Eupropean Photovoltaic Solar Energy Conference, Jun. 1, 2004, pp. 419-422, XP008078903.
International Search Report from Application No. PCT/US2012/032616, dated Nov. 30, 2012, 1 pg.
International Search Report from Application No. PCT/US2012/032618, dated Nov. 28, 2012, 1 pg.
Chen Jinxin, et al., "White Light OLED Illumination", Shanghai Jiaotong University Press, dated Jan. 31, 2011, pp. 203 and 204.

* cited by examiner

MULTILAYER COMPONENT FOR THE ENCAPSULATION OF A SENSITIVE ELEMENT

CROSS-REFERENCE TO RELATED APPLICATION(S)

The present application claims priority from French Patent Application No. 1153113, filed Apr. 8, 2011, entitled "MULTILAYER COMPONENT FOR THE ENCAPSULATION OF A SENSITIVE ELEMENT," naming inventors Charles Leyder, Claire Thoumazet, and Martin Python, which application is incorporated by reference herein in its entirety.

FIELD OF THE DISCLOSURE

The present invention relates to a multilayer component for encapsulating an element which is sensitive to air and/or moisture, such as an organic light-emitting diode or a photovoltaic cell. The invention also relates to a device, especially a multilayer electronic device, comprising such a multilayer component, and to a process for fabricating such a multilayer component.

BACKGROUND

A multilayer electronic device comprises a functional element consisting of an active part and two electrically conducting contacts, also called electrodes, on either side of this active part. Examples of multilayer electronic devices comprise in particular: organic light-emitting diode (OLED) devices in which the functional element is an OLED, the active part of which is designed to convert electrical energy into radiation; photovoltaic devices in which the functional element is a photovoltaic cell, the active part of which is designed to convert the energy from radiation into electrical energy; electrochromic devices in which the functional element is an electrochromic system, the active part of which is designed to switch reversibly between a first state and a second state having optical transmission properties and/or energy transmission properties different from those of the first state; and electronic display devices in which the functional element is an electronic ink system comprising electrically charged pigments that are capable of moving depending on the voltage applied between the electrodes.

As is known, irrespective of the technology employed, the functional elements of a multilayer electronic device are liable to be degraded due to the effect of environmental conditions, especially due to the effect of exposure to air or moisture. As an example, in the case of OLED or organic photovoltaic cells, the organic materials are particularly sensitive to the environmental conditions. In the case of electrochromic systems, electronic ink systems or thin-film photovoltaic cells comprising an inorganic absorber layer, the transparent electrodes, which are based on a TCO (transparent conductive oxide) layer or based on a transparent metallic layer, are also liable to be degraded due to the effect of environmental conditions.

To protect the functional elements of a multilayer electronic device from degradation due to exposure to air or moisture, it is known to fabricate the device with a laminated structure in which the functional elements are encapsulated with a front protection substrate and possibly with a back protection substrate.

Depending on the application of the device, the front and back substrates may be made of glass or an organic polymer material. An OLED or a photovoltaic cell encapsulated with a flexible polymer substrate, rather than a glass substrate, has the advantage of being pliable, ultra-thin and light. Moreover, in the case of an electrochromic system or a photovoltaic cell that includes an absorber layer based on a chalcopyrite compound, especially one containing copper, indium and selenium, called a CIS absorber layer, to which may optionally be added gallium (CIGS absorber layer), aluminum or sulfur, the device is conventionally assembled by lamination using an interlayer made of an organic polymer material. The lamination interlayer, which is positioned between an electrode of the functional element and the corresponding protection substrate, then makes it possible to guarantee proper cohesion of the device.

However, it has been found that, when a multilayer electronic device comprises an organic polymer lamination interlayer or an organic polymer substrate positioned against a functional element sensitive to air and/or moisture, the device has a high rate of degradation. This is because the presence of the organic polymer lamination interlayer, which tends to store moisture, or in the presence of the organic polymer substrate, which has a high permeability, promotes the migration of contaminating species such as water vapor or oxygen into the sensitive functional element, and therefore impairs the properties of this functional element.

SUMMARY OF THE INVENTION

The invention is more particularly intended to remedy these drawbacks by providing a multilayer component which, when it is integrated into a multilayer electronic device, gives this device improved resistance, especially to air and moisture, ensuring effective protection over a very long period of the functional elements of the device, at least some of which are sensitive to air and/or moisture.

For this purpose, one subject of the invention is a multilayer component for encapsulating an element which is sensitive to air and/or moisture, such as an organic light-emitting diode or a photovoltaic cell. The multilayer component can include an organic polymer layer and at least one barrier stack. Each barrier stack can include at least three successive layers. The layers of the barrier stack can have alternately lower and higher degrees of crystallinity. The ratio of the degree of crystallinity of a layer of higher degree of crystallinity to the degree of crystallinity of a layer of lower degree of crystallinity can be greater than or equal to 1.1.

Another subject of the invention is a device comprising an element sensitive to air and/or moisture and a multilayer component as described above as front and/or back encapsulant for the sensitive element.

As nonlimiting examples, the sensitive element is entirely or partly of a photovoltaic cell, of an organic light-emitting diode, of an electrochromic system, of an electronic-ink display system or of an inorganic light-emitting system.

Another subject of the invention is a process for fabricating a multilayer component comprising an organic polymer layer and at least one barrier stack. Each barrier stack comprises layers. At least some of the layers of the barrier stack can be deposited by sputtering. In one embodiment, sputtering can include magnetron sputtering. At least some of the layers of the barrier stack can be deposited by chemical vapor deposition. In one embodiment, chemical vapor deposition can include plasma-enhanced chemical vapor deposition. In one further embodiment, chemical vapor deposition can include atomic layer deposition. Moreover, the layers of the barrier stack can be deposited or by a combination of these techniques.

BRIEF DESCRIPTION OF THE DRAWINGS

The features and advantages of the invention will become apparent in the following description of several embodiments of a multilayer component according to the invention, this description being given solely by way of example and with reference to the appended drawings in which.

Figure 1:
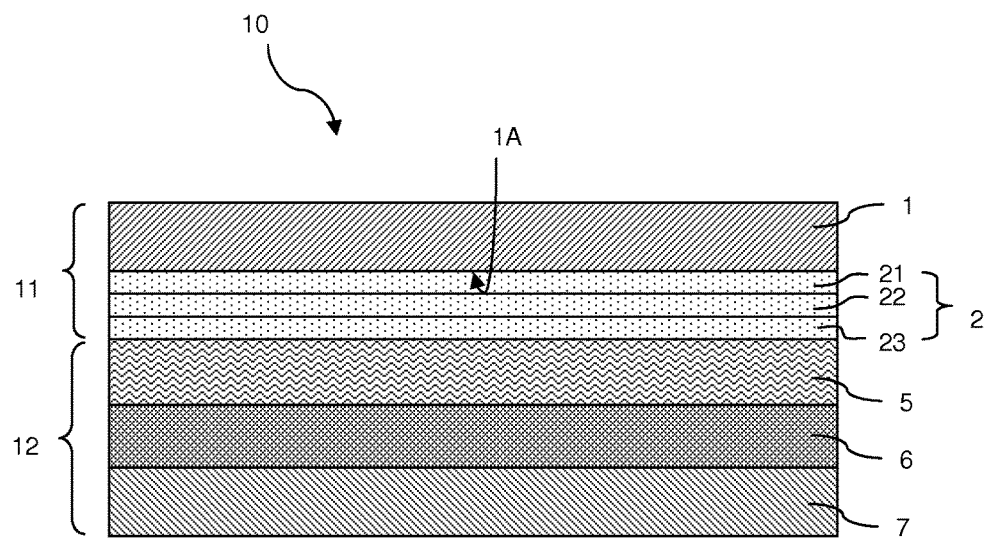
FIG. 1 includes a schematic cross section through an OLED device comprising a multilayer component in accordance with a first embodiment of the invention.

For the sake of visibility, the relative thicknesses of the layers have not been strictly respected in FIGS. 1 to 7.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the roofing product arts and corresponding manufacturing arts.

In one embodiment, a multilayer component encapsulates an element which is sensitive to air and/or moisture. Such an element can be an organic light-emitting diode or a photovoltaic cell. The multilayer component can include an organic polymer layer and at least one barrier stack. Each barrier stack can include at least three successive layers. The layers of the barrier stack can have alternately lower and higher degrees of crystallinity.

The degree of crystallinity considered here may be the volume degree of crystallinity defined as the ratio of the volume of crystalline material present in the layer to the total volume of material in the layer.

In the context of the invention, the expression "encapsulation of a sensitive element" is understood to mean that at least part of the sensitive element is protected in such a way that the sensitive element is not exposed to the environmental conditions. In particular, the multilayer component may cover the sensitive element, or else the sensitive element may be deposited on the multilayer component. In the case of the protection of the sensitive layers of a thin-film functional element, for example an OLED, the barrier stack may be included in the functional element, for example in the stack making up the electrode of the OLED. It should be noted that, in the context of the invention, a multilayer component is an assembly of layers placed against one another, irrespective of the order in which the constituent layers of the element are deposited on one another.

In accordance with the objectives of the invention, the presence of at least one barrier stack comprising an alternation of layers having substantially different degrees of crystallinity makes it possible to limit the migration of water vapor from the polymer layer into the sensitive element. This is because said alternation of layers having different degrees of crystallinity makes it possible to decouple the permeation paths of contaminating species, such as water vapor or oxygen, between one layer and the next layer. The permeation paths in the barrier stack, and consequently the permeation times, are thus significantly lengthened. One particularly favorable configuration for this permeation path decoupling effect is the alternation between amorphous layers and crystalline layers.

In the context of the invention, the degrees of crystallinity of two successive layers of the barrier stack are determined and compared by making an X-ray diffractometry measurement, especially in a Bragg-Brentano configuration, on each of the two layers. A transmission electron microscopy (TEM) measurement may also be carried out, in particular in the case when two successive layers of the barrier stack are of the same chemical nature but of different degrees of crystallinity.

In one embodiment, the aforementioned at least three successive layers are alternately in an amorphous state and in an at least partially crystalline state. In other words, the or each layer of lower degree of crystallinity is in an amorphous state, with a zero degree of crystallinity. In the context of the invention, a layer is said to be in an amorphous state if, using an X-ray diffractometry measurement in a Bragg-Brentano configuration on the layer, no diffraction peak having an intensity equal to or greater than twice the standard deviation of the background noise of the measurement is detected. Conversely, a layer is said to be in an at least partially crystalline state if, when using an X-ray diffractometry measurement in a Bragg-Brentano configuration on the layer, at least one diffraction peak having an intensity equal to or greater than twice the standard deviation of the background noise of the measurement is detected.

The degree of crystallinity between two layers can be determined by comparing the intensity of analogous diffraction peaks. The ratio of the intensity of a layer with higher degree of crystallinity over the intensity of a layer with a lower degree of crystallinity will be greater than 1. The comparison between analogous peaks can be averaged over the range of the diffraction measurement. In embodiments, the ratio of the intensity of a layer with higher degree of crystallinity over the intensity of a layer with a lower degree of crystallinity will be greater than 1, such as greater than or equal to 1.1, greater than or equal to 1.2, greater than or equal to 1.5, greater than or equal to 1.7, greater than or equal to 2.0, or even greater than or equal to 3.0. In another embodiment, the ratio of the intensity of a layer with higher degree of crystallinity over the intensity of a layer with a lower degree of crystallinity will be less than 4.0, such as less than 3.0, or less than 2.5.

Other embodiments of the invention are described below, which may be taken in isolation or in any technically possible combination.

According to one feature, the difference between the volume degree of crystallinity of a layer of higher degree of crystallinity and the volume degree of crystallinity of a layer of lower degree of crystallinity is equal to or greater than 10%, such as equal to or greater than 15%, equal to or greater than 20%, or even equal to or greater than 25%.

According to another feature, the ratio of the degree of crystallinity of a layer of higher degree of crystallinity to the degree of crystallinity of a layer of lower degree of crystallinity is equal to or greater than 1.2, such as equal to or greater than 1.5, equal to or greater than 1.7, equal to or greater than 2.0, or even equal to or greater than 3.0.

According to one feature, each layer of the or each barrier stack has a geometric thickness of between 5 nm and 200 nm, preferably between 5 nm and 100 nm and more preferably between 5 nm and 70 nm. In one embodiment, the thickness can be at least 5 nm, such as at least 10 nm, at least 20 nm, at least 40 nm, or even at least 100 nm. In another embodiment, the thickness can be no greater than 200 nm, such as no greater than 150 nm, no greater than 120 nm, no greater than 100 nm, or even no greater than about 80 nm.

In the context of the invention, the aforementioned at least three successive layers may be inorganic layers of the same chemical nature or of different chemical nature. Each layer of the or each barrier stack is inorganic and may in particular be a metal, oxide, nitride or oxynitride layer. When it is an oxide, nitride or oxynitride layer, it may be doped. As an example, ZnO, Si3N4 or SiO2 layers may be doped with aluminum, especially so as to improve their electrical conductivity. The layers of the or each barrier stack may be deposited by conventional thin-film deposition processes such as, by way of nonlimiting examples: magnetron sputtering; chemical vapor deposition (CVD), in particular plasma-enhanced chemical vapor deposition (PECVD); atomic layer deposition (ALD); or a combination of these processes, the deposition process chosen possibly being different from one layer to another in the barrier stack.

According to one embodiment, the multilayer component comprises an interfacial layer positioned between the polymer layer and the barrier stack. This interfacial layer is an organic layer, for example of the acrylic or epoxy resin type, or a hybrid organic-inorganic layer, especially in which the inorganic part, which may for example be silica SiOx, represents between 0% and 50% by volume of the layer. This interfacial layer acts in particular as a smoothing or planarization layer. The interfacial layer can have a thickness of at least 1 micron, such as at least 2 microns, at least 3 microns, or even at least 4 microns. In further embodiments, the interfacial layer has a thickness of no greater than 10 microns, such as no greater than 8 microns, or no greater than 6 microns. In an embodiment, the interfacial layer is a UV-cured acrylate layer having a thickness of at approximately 1 to 10 microns, such as 4 to 5 microns.

According to another embodiment, the constituent layers of the or each barrier stack have alternately lower and higher refractive indices. For suitable geometric thicknesses of these constituent layers, the barrier stack may then constitute an interference filter and act as an antireflection coating. In a particular embodiment, the multilayer component serves as the front encapsulation of a radiation collecting or emitting functional element, such as an OLED or a photovoltaic cell. This therefore ensures the light flux that is extracted from the functional element or that reaches the functional element is large, therefore, in the case of an OLED or a photovoltaic cell, making it possible to obtain a high energy conversion efficiency. Suitable geometric thicknesses of the layers of the barrier stack may be selected, especially by means of optimization software.

According to one embodiment, the polymer layer and the or each barrier stack are transparent. In the context of the invention, a layer or a stack of layers is considered to be transparent when it is transparent within at least the useful wavelength range for the intended application. As an example, in the case of a photovoltaic device comprising photovoltaic cells based on polycrystalline silicon, each transparent layer is transparent within the wavelength range between 400 nm and 1200 nm, these being the useful wavelengths for this type of cell. In particular, the or each barrier stack may be a stack of thin films, the geometric thickness of which is designed to maximize the transmission of radiation through the multilayer component, either to or from the sensitive element, by an antireflection effect. In the context of the invention, a thin film is understood to mean a layer having a thickness of less than 1 micron.

According to one feature, the multilayer component comprises, starting from the polymer layer, at least two barrier stacks separated by an organic or hybrid organic-inorganic intermediate layer. This intermediate layer, which may for example be a polyacrylate layer, has two functions. Firstly, it makes it possible to improve mechanical behavior of the overall stack by mechanically decoupling the two inorganic barrier stacks, thereby preventing crack propagation. Secondly, it makes it possible to limit the growth of corresponding defects from one inorganic barrier stack to the other, and thus makes it possible to increase the effective length of the permeation paths of contaminating species such as oxygen and water vapor in the overall stack.

In the context of the invention, the multilayer component may comprise at least one barrier stack alongside that face of the polymer layer which is intended to be directed toward the sensitive element and/or at least one barrier stack alongside that face of the polymer layer which is intended to be directed away from the sensitive element.

The polymer layer of the multilayer component may be a substrate, especially a layer based on polyethylene terephthalate (PET), polyethylene naphthalate (PEN), polycarbonate, polyurethane, polymethyl methacrylate, polyamide, polyimide, a fluoropolymer, such as ethylene-tetrafluoroethylene (ETFE), polyvinylidene fluoride (PVDF), polychlorotrifluoroethylene (PCTFE), ethylene-chlorotrifluoroethylene (ECTFE) and fluorinated ethylene-propylene copolymers (FEP).

As a variant, the polymer layer of the multilayer component may be a lamination interlayer for bonding to a rigid or flexible substrate. This polymer lamination interlayer may be, especially, a layer based on polyvinyl butyral (PVB), ethylene-vinyl acetate (EVA), polyethylene (PE), polyvinyl chloride (PVC), a thermoplastic urethane, an ionomer, a polyolefin-based adhesive or a thermoplastic silicone.

Another subject of the invention is the use of a multilayer component as described above for encapsulating an element which is sensitive to air and/or moisture, such as an organic light-emitting diode or a photovoltaic cell.

Another subject of the invention is a device comprising an element sensitive to air and/or moisture and a multilayer component as described above as front and/or back encapsulant for the sensitive element.

As nonlimiting examples, the sensitive element is entirely or partly of a photovoltaic cell, of an organic light-emitting diode, of an electrochromic system, of an electronic-ink display system or of an inorganic light-emitting system.

Finally, another subject of the invention is a process for fabricating a multilayer component as described above, in which at least some of the layers of the or each barrier stack are deposited by sputtering, especially magnetron sputtering, or by chemical vapor deposition, especially plasma-enhanced chemical vapor deposition, or by atomic layer deposition or by a combination of these techniques.

The OLED device 10 shown in FIG. 1 comprises a front substrate 1 having a glazing function and an OLED 12 formed by the juxtaposition of a front electrode 5, a stack 6 of organic electroluminescent layers and of a back electrode 7. The OLED 12 is the functional element of the device 10. The front substrate 1 is placed on the side where the radiation is extracted from the device 10 and is made of a transparent polymer, especially, as an example, made of polyethylene terephthalate (PET) or polyethylene naphthalate (PEN) having a geometric thickness of between 25 microns and 175 microns. In embodiments, the thickness of substrate 1 can be at least 25 microns, such as at least 50 microns, at least 75 microns, at least 100 microns, or even at least 150 microns. In another embodiment, the thickness of substrate 1 is not greater than 200 microns, such as not greater than 175 microns, or not greater than 150 microns.

The front electrode 5 comprises a transparent electroconducting coating, such as one based on tin-doped indium oxide (ITO) or a stack with a silver layer. The stack of organic layers 6 comprises a central electroluminescent layer sandwiched between an electron transport layer and a hole transport layer, which are themselves sandwiched between an electron injection layer and a hole injection layer. The back electrode 7 is made of an electrically conducting material, in particular a metallic material of the silver or aluminum type or, especially when the OLED device 10 is both front-emitting and rear-emitting, made of a TCO. The organic layers 6 and the electrodes 5 and 7 are sensitive layers, the properties of which are liable to be degraded due to the effect of exposure to air or moisture. In particular in the presence of water vapor or oxygen, the luminescence properties of the organic layers 6 and the conductivity properties of the electrodes 5 and 7 may be degraded.

To protect these sensitive layers when exposed to external environmental conditions, the device 10 includes a barrier stack 2 which is inserted between the front substrate 1 and the front electrode 5. The superposed substrate 1/barrier stack 2 combination, in which the barrier stack 2 is placed against that face 1A of the substrate 1 which is intended to be directed toward the interior of the OLED device, forms a multilayer component 11 which is shown on a larger scale in FIG. 3. In practice, the layers of the barrier stack 2 are deposited in succession on the face 1A of the polymer substrate 1, especially by magnetron sputtering. The front electrode 5, the organic layers 6 and the back electrode 7 are deposited later.

In this embodiment, the barrier stack 2 consists of a stack of three transparent thin layers 21, 22, 23 having alternately lower and higher degrees of crystallinity. In embodiments, the layers 21 to 23 are alternately in an amorphous state and in a crystalline state. For example, in one embodiment layer 21 can be in an amorphous state, layer 22 can be in a crystalline state and layer 23 can be in an amorphous state. In accordance with the invention, the barrier stack 2 serves to protect the sensitive layers 5, 6, 7 by preventing the migration of contaminating species, such as water vapor or moisture, towards these layers. Preferably, the barrier stack 2 is also optimized to guarantee good radiation extraction from the OLED 12 by an antireflection effect at the interface between the substrate 1 and the front electrode 5. Loss of radiation emitted by the OLED 12 may occur at this interface by reflection, owing to the difference in refractive indices of the constituent materials of the substrate 1 and the front electrode 5. However, by providing alternately lower and higher refractive indices of the thin layers 21, 22, 23, and for suitable geometric thicknesses of these layers, the barrier stack 2 may constitute an interference filter and provide an antireflection function at the interface between the substrate 1 and the front electrode 5. These suitable geometric thicknesses of the layers of the barrier stack 2 may especially be selected using optimization software.

Figure 2:
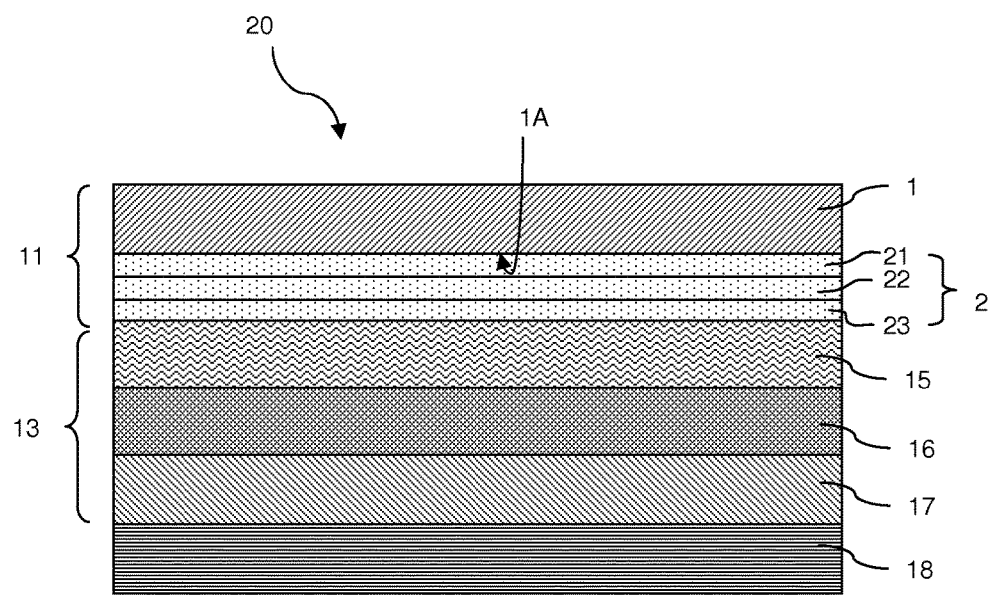
FIG. 2 includes a cross section similar to FIG. 1 for a photovoltaic solar module comprising the multilayer component of FIG. 1.
Figure 3:
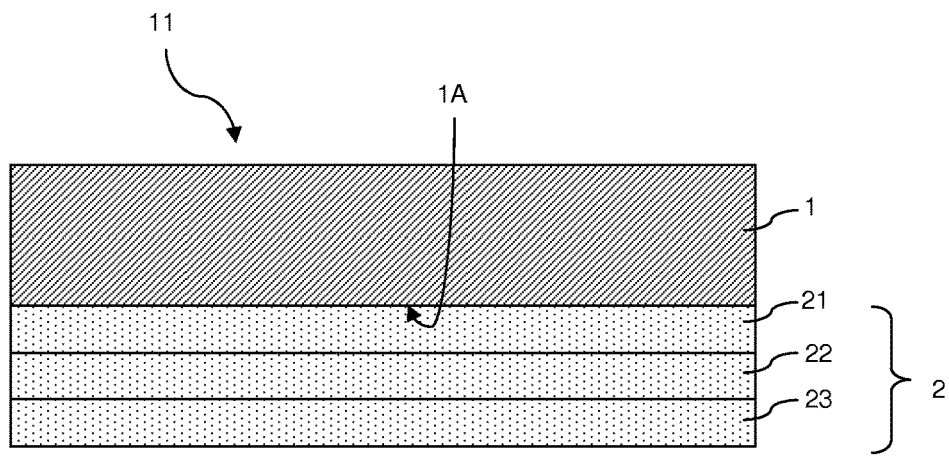
FIG. 3 includes a view on a larger scale of the multilayer component of FIGS. 1 and 2.

FIG. 2 illustrates the case in which a thin-film photovoltaic solar module 20 is equipped by the multilayer component 11 of FIG. 1. The polymer substrate 1 of the multilayer component 11 forms the front substrate of the module 20, which is placed on the side where the solar radiation is incident on the module, and the barrier stack 2 is directed toward the interior of the module. The module 20 also includes, as is known, a back substrate 18 having a support function, which is made of any appropriate material, whether transparent or not.

The back substrate 18 bears, on its face directed towards the interior of the module 20, that is to say on the side where the solar radiation is incident on the module, an electrically conducting layer 17 that forms a back electrode of the photovoltaic cell 13 of the module 20. As an example, the layer 17 is a metallic layer, especially made of silver or aluminum. The layer 17 forming the back electrode is surmounted by an absorber layer 16 based on amorphous silicon, suitable for converting solar energy to electrical energy. The absorber layer 16 itself is surmounted by a moisture-sensitive electrically conducting layer 15, for example based on aluminum-doped zinc oxide (AZO), which forms a front electrode of the cell 13. The photovoltaic cell 13 of the module 20 is thus formed by the stack of layers 15, 16 and 17.

As in the case of the OLED device 10, the multilayer component 11 incorporated into the module 20 provides both effective protection of the underlying sensitive layers 15, 16 and 17, by virtue of the barrier stack 2 that limits and retards the migration of contaminating species toward these layers, and optimum radiation transmission from the outside of the module 20 into the absorber layer 16.

Figure 4:
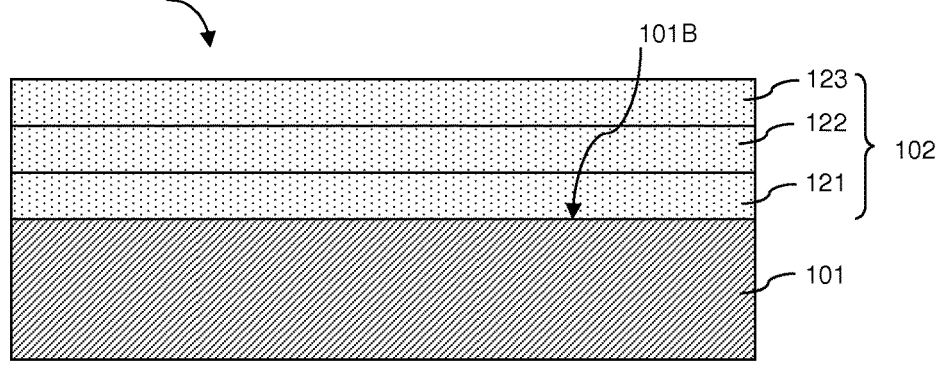
FIG. 4 includes a view similar to FIG. 3 for a multilayer component in accordance with a second embodiment of the invention.

In the second embodiment of the multilayer component shown in FIG. 4, the elements similar to those of the first embodiment bear identical references increased by 100. The multilayer component 111 according to this second embodiment is intended for equipping a device that includes an element sensitive to air and/or moisture, for example a photovoltaic module or an OLED device. The multilayer component 111 comprises a substrate 101 made of a transparent polymer, especially, for example, polyethylene terephthalate (PET) or polyethylene naphthalate (PEN) having a geometric thickness of a few hundred microns, and a barrier stack 102 on that face 101B of the substrate which is intended to be directed away from the sensitive element. Thus, the multilayer component 111 differs from the multilayer component 11 of the first embodiment in that the barrier stack is placed on that face of the substrate which is intended to be directed away from the sensitive element and not on that face of the substrate which is intended to be directed toward the sensitive element.

In a manner similar to the first embodiment, the barrier stack 102 consists of a stack of three thin transparent layers 121, 122, 123 having alternately lower and higher degrees of crystallinity. In one embodiment, the layers 121 to 123 are alternately in an amorphous state and in a crystalline state. For example, in one embodiment layer 121 can be in an amorphous state and layer 122 can be in a crystalline state and layer 123 can be in an amorphous state. In accordance with the invention, the barrier stack 102 serves to limit and retard the migration of contaminating species, such as water vapor or moisture. In one embodiment, the barrier stack 102 is also designed with suitable geometric thicknesses and refractive indices of the layers 121, 122, 123 so that the barrier stack 102 provides an antireflection function at the interface between the polymer substrate 101 and the air. The presence of the barrier stack 102 at this interface is all the more effective for maximizing the transmission of radiation through the multilayer component when, owing to the large difference in refractive index between the constituent polymer material of the substrate 101 and air, there is a high level of reflection at this interface.

Figure 5:
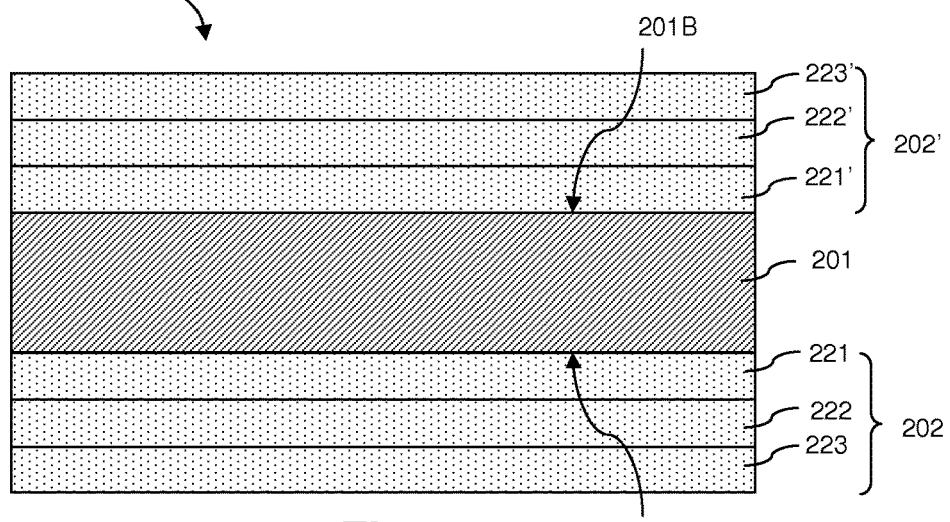
FIG. 5 includes a view similar to FIG. 3 for a multilayer component in accordance with a third embodiment of the invention.

In the third embodiment of a multilayer component shown in FIG. 5, the elements analogous to those of the first embodiment bear identical references increased by 200. The multilayer component 211 according to this third embodiment is intended for equipping a device that includes an element sensitive to air and/or moisture, for example a photovoltaic module or an OLED device. The multilayer component 211 comprises a substrate 201 made of a transparent polymer, especially, for example, polyethylene terephthalate (PET) or polyethylene naphthalate (PEN) having a geometric thickness of a few hundred microns, but differs from the multilayer components 11 and 111 of the previous embodiments in that it comprises two three-layer barrier stacks 202 and 202' that are deposited on the face 201A of the substrate 201 intended to be directed toward the sensitive element and on the face 201B of the substrate 201 intended to be directed away from the sensitive element, respectively.

Each of the two barrier stacks 202 and 202' is a stack of three transparent thin layers 221, 222, 223 or 221', 222', 223' having alternately lower and higher degrees of crystallinity. In embodiments, the layers can be alternately in an amorphous state and in a crystalline state. The multilayer component 211 having two barrier stacks provides effective protection of the underlying sensitive layers against contaminating species, such as water vapor or moisture, and minimizes radiation reflection both at the interface between the multilayer component and the air and at the interface between the multilayer component and the underlying layer of a device in which the multilayer component is integrated.

Figure 6:
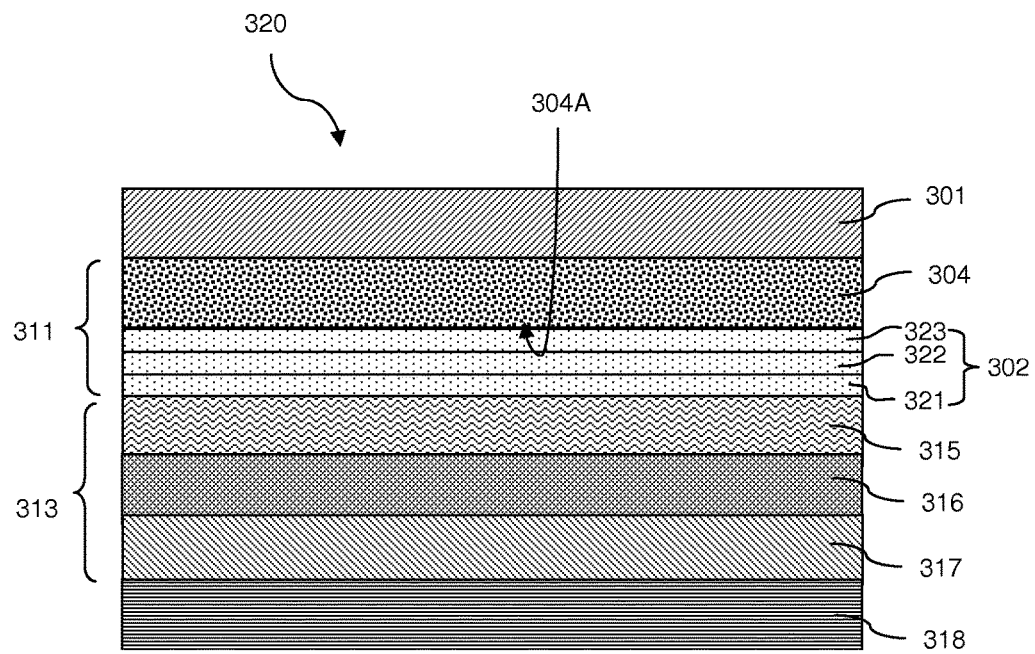
FIG. 6 includes a cross section similar to FIG. 1 for a photovoltaic solar module comprising a multilayer component in accordance with a fourth embodiment of the invention.
Figure 7:
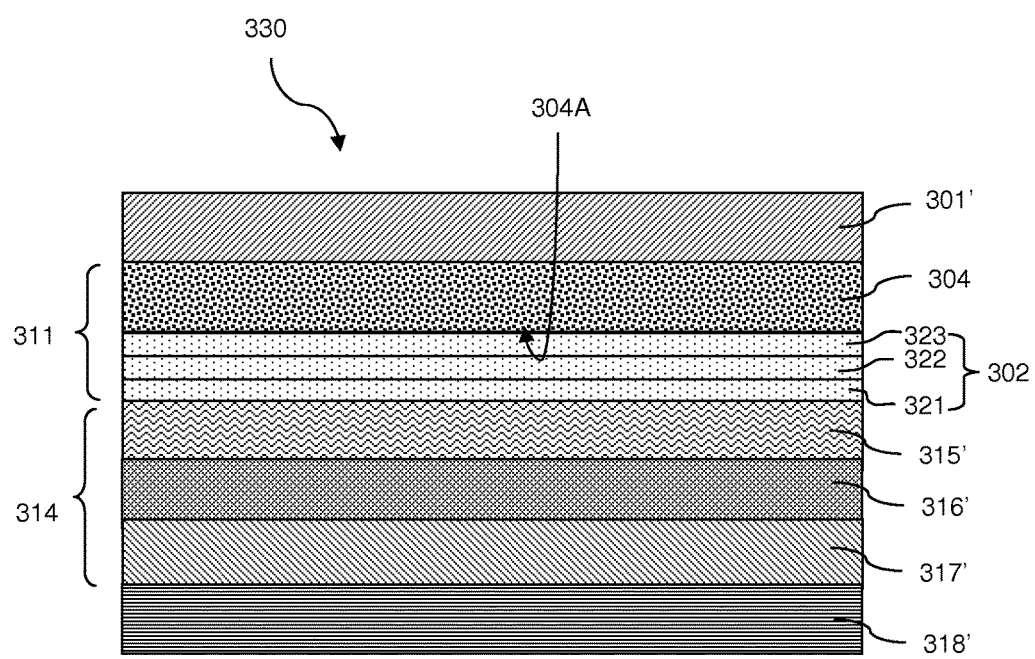
FIG. 7 includes a view similar to FIG. 6 for an electrochromic device comprising the multilayer component of FIG. 6.

In the fourth embodiment of a multilayer component illustrated in FIGS. 6 and 7, the elements similar to those of the first embodiment bear identical references increased by 300.

The photovoltaic solar module 320 shown in FIG. 6 differs from the module 20 of FIG. 2 in that its absorber layer 316 is based on a chalcopyrite compound, especially CIS or CIGS. As is known, a thin-film photovoltaic module in which the absorber is based on silicon or cadmium telluride is fabricated in superstrate mode, that is to say by successive deposition of the constituent layers of the device starting from the front substrate, whereas a thin-film photovoltaic module in which the absorber is based on a chalcopyrite compound is fabricated in substrate mode, that is to say by successive deposition of the constituent layers of the cell on the back substrate. Assembly of the module having a chalcopyrite absorber then takes place conventionally by lamination using a polymer interlayer positioned between the front electrode and the front substrate of the module.

In FIG. 6, the photovoltaic solar module 320 comprises a front substrate 301 made either of glass or a transparent polymer. The module 320 also comprises a back substrate 318 which bears, on its face directed toward the interior of the module 320, an electrically conducting layer 317 forming a back electrode of the photovoltaic cell 313 of the module. As an example, the layer 317 is based on molybdenum.

The layer 317 forming the back electrode is surmounted by the absorber layer 316 based on a chalcopyrite compound, especially CIS or CIGS. The absorber layer 316 is itself surmounted by a layer of cadmium sulfide CdS (not shown) which is optionally combined with a layer of undoped intrinsic ZnO (also not shown) and then by a moisture-sensitive electrically conducting layer 315, for example based on aluminum-doped zinc oxide (AZO), which forms a front electrode of the cell 313. The photovoltaic cell 313 of the module 320 is thus formed by the stack of layers 315, 316 and 317.

A polymer lamination interlayer 304 made of EVA, designed to bond the functional layers of the module 320 between the front substrate 301 and the back substrate 318, is positioned above the electrode 315 against the front substrate 101. As a variant, the lamination interlayer 304 may be made of PVB or any other material having suitable properties. To protect the AZO layer 315, which is a moisture-sensitive layer, from the moisture possibly stored in the lamination interlayer 304, the module 320 includes a barrier stack 302 sandwiched between the layers 304 and 315.

The superposed lamination interlayer 304 and barrier stack 302 form a multilayer component 311 in which the barrier stack 302 is positioned against that face 304A of the layer 304 which is intended to be directed toward the interior of the module. As in the first embodiment, the barrier stack 302 consists of a stack of three transparent thin layers 321, 322, 323 having alternately lower and higher degrees of crystallinity, preferably alternately in an amorphous state and in a crystalline state, in which the geometric thickness of each thin layer of the stack 302 is optimized from an optical standpoint in order to obtain an antireflection effect at the interface between the EVA lamination interlayer 304 and the AZO layer 315 forming the front electrode. It should be noted that the decrease in reflection that can be achieved in this example thanks to the barrier stack 302 is particularly large, owing to the large difference in refractive index between the lamination interlayer and the AZO.

FIG. 7 illustrates the case in which an electrochromic device 330 is equipped by the multilayer component 311 of FIG. 6. In FIG. 7, the elements analogous to those of FIG. 6 bear identical references. The device 330 comprises two substrates 301' and 318' made of any appropriate transparent material. An electrochromic system 314 is placed between the substrates 301' and 318'. The electrochromic system 314 may be of any appropriate type. It may in particular be what is called a hybrid electrochromic system in which two mineral electrochromic layers are separated by an organic electrolyte, or may be an all-solid-state electrochromic system in which the electrochromic layers and the electrolyte are mineral layers.

Irrespective of its type, the electrochromic system 314 comprises, in succession starting from the substrate 318', a transparent electrode 317', which may in particular be made of a TCO, a stack 316' of electrochromic active layers, and a second transparent electrode 315', which may also be made of a TCO. The polymer lamination interlayer 304 of the multilayer component 311 is positioned above the electrode 315', against the substrate 301', and the barrier stack 302 of the multilayer component 311 is sandwiched between the layers 304 and 315' so as to protect the layer 315'.

As a nonlimiting example, in the four embodiments described above, each barrier stack comprises the following succession of layers deposited by magnetron sputtering: Si3N4/ZnO/Si3N4.

As is apparent from the above embodiments, a multilayer component according to the invention, which comprises a barrier stack, the layers of which have alternately lower and higher degrees of crystallinity, makes it possible to give a device in which it is placed greater resistance to any degradation induced by exposure to air or moisture. This improved resistance is obtained without impairing the transmission of radiation from or to the active layers of the device since the barrier stack can be optically optimized.

EXAMPLES

Examples of barrier stacks, deposited on a flexible substrate made of polyethylene terephthalate with an interfacial layer on the barrier deposition surface of the substrate (herein denoted "PET") having a geometric thickness of 0.125 mm, are given in Table 1 below. In an embodiment the interfacial layer is an UV-cured acrylate layer having a thickness between 1 and 10 micron, such as between 4 and 5 microns. The interfacial layer planarizes and smoothens the polyethylene terephtalate surface.

The properties of the stacks given in Table 1 are the following:

$T_L$: % light transmission in the visible range, measured under illuminant $D_{65}/2°$ observer conditions;

$R_L$: % light reflection in the visible range, measured under illuminant $D_{65}/2°$ observer conditions;

A: % light absorption in the visible range, such that:

$T_L + R_L + A = 1$;

WVTR (water vapor transfer rate): water vapor transmission rate in g/m²·day, measured using the MOCON AQUATRAN system at 37.8° C. and 100% relative humidity with an 8 hour cycle [NB: the detection threshold of the MOCON system is 5×10 g/m²·day].

TABLE 1

| | Example | | | PET |
|---|---|---|---|---|
| | 1 | 2 | 3 | only |
| PET thickness | 0.125 mm | 0.125 mm | 0.125 mm | 0.125 mm |
| Barrier stack | 50 nm Si₃N₄ | 50 nm Si₃N₄ | 50 nm SnZnO | |
| | 50 nm ZnO | 50 nm SiO₂ | 50 nm Si₃N₄ | |
| | 50 nm Si₃N₄ | 50 nm Si₃N₄ | 50 nm SnZnO | |
| Properties of the stack | | | | |
| $T_L$ (%) | 85 | 82.6 | 85.5 | 87.5 |
| $R_L$ (%) | 14.5 | 17 | 13.5 | 12.5 |
| A (%) | 0.5 | 0.4 | 1 | 0 |
| WVTR (g/m² · day) | <10⁻³ | <10⁻² | <10⁻² | >1 |

In example 1 according to the invention, the barrier stack comprises three layers, with an alternation in crystallinity, wherein the Si₃N₄ layers are in the amorphous state and ZnO is at least a partially crystalline state.

In comparative examples 2 and 3, the barrier stack comprises three layers that are all in the amorphous state.

It may be seen that the barrier stack of example 1 according to the invention makes it possible to achieve a WVTR better by a factor of ten than that of the barrier stack of comparative examples 2 and 3.

For each of the examples in Table 1, the deposition conditions under which the layers were deposited by magnetron sputtering were the following:

TABLE 2

| Layer | Target employed | Deposition pressure | Gas |
|---|---|---|---|
| ZnO | 98.2 wt % Zn:Al | 2 × 10⁻³ mbar | Ar/O₂ |
| SnZnO | 34/65/1 wt % SnZn:Sb | 2 × 10⁻³ mbar | Ar/O₂ |
| Si₃N₄ | 92.8 wt % Si:Al | 2 × 10⁻³ mbar | Ar/N₂ |
| SiO₂ | 92.8 wt % Si:Al | 2 × 10⁻³ mbar | Ar/O₂ |

The invention is not limited to the examples described and shown.

In particular, in the examples described above, the or each barrier stack is transparent. In embodiments, the multilayer component comprising at least one barrier stack has a transparency under illuminant $D_{65}/2°$ observer conditions of at least 75%, such as at least 80%, at least 85%, at least 90%, at least 92%, or even at least 94%. As a variant, at least one barrier stack of a multilayer component according to the invention need not be transparent, especially when the multilayer component is used for the back encapsulation of a photovoltaic cell or an OLED emitting only via the front, or for the front and/or back encapsulation of an element that is liable to be degraded due to the effect of the environmental conditions but for which no transparency condition is required.

Moreover, the or each barrier stack of the multilayer component may comprise any number, equal to or greater than three, of superposed layers, it being possible for the chemical compositions and the thicknesses of these layers to be different from those described above. Each layer of the barrier stack may be a thin film of metal or a thin film of oxide, nitride or oxynitride having in particular a chemical composition of the $MO_x$, $MN_y$, or $MO_xN_y$ type, optionally hydrogenated, carbonated or doped, where M is a metal chosen for example from Si, Al, Sn, Zn, Zr, Ti, Hf, Bi and Ta or alloys thereof. For a given chemical composition of the layers of the barrier stack, the respective geometric thicknesses of these layers are selected, for example by means of optimization software, so as to maximize the radiation transmission through the multilayer component.

In addition, when the layers of the multilayer component are deposited on the polymer layer, an organic interfacial layer, for example of the acrylic or epoxy resin type or hybrid organic-inorganic type, may be placed beforehand on the polymer layer so as in particular to provide a smoothing or planarization function.

Finally, a multilayer component according to the invention may be used in any type of device that includes an element sensitive to air and/or moisture without being limited to the OLED, photovoltaic and electrochromic devices described and shown. In particular, the invention may be applied for the encapsulation of thin-film photovoltaic cells, whether the absorber layer is a thin film based on amorphous or microcrystalline silicon, or based on cadmium telluride or based on a chalcopyrite compound, such as CIS or CIGS. The invention may also be applied for the encapsulation of organic photovoltaic cells, the organic absorber layer of which is particularly sensitive to the environmental conditions or for the encapsulation of photovoltaic cells comprising polycrystalline or single-crystal silicon wafers forming a p/n junction. The invention may also be applied to modules made up of Grätzel cells with a photosensitive pigment, also called DSSCs (dye-sensitized solar cells), for which exposure to moisture may result, apart from electrode deterioration, in a malfunction of the electrolyte, causing undesirable electrochemical reactions. Other examples of multilayer electronic devices to which the invention is applicable are: electronic display devices, the active part of which comprises electrically charged pigments capable of moving according to the voltage applied between the electrodes; and inorganic electroluminescent devices, the active part of which comprises an active medium sandwiched between dielectrics, in which the active medium is composed of a crystal lattice that acts as a host matrix, especially one based on sulfides or oxides, and of a dopant that gives rise to the luminescence, for example ZnS: Mn or SrS: Cu, Ag.

A process for fabricating a multilayer component in accordance with the invention, comprising a polymer layer and at least one multilayer barrier stack, comprises the thin-film deposition of the layers of the barrier stack. One possible technique for depositing the layers is magnetron sputtering.

In this process, a plasma is created in a high vacuum close to a target comprising the chemical elements to be deposited. The active species of the plasma, on bombarding the target, tear off said chemical elements which are deposited on the substrate, forming the desired thin film. This process is a "reactive" process when the layer is made of a material resulting from a chemical reaction between the elements torn off from the target and the gas contained in the plasma. The major advantage of this process lies in the possibility of depositing a very complex multilayer stack on one and the same line by making the substrate pass in succession beneath various targets.

Sputtering makes it possible to vary certain physico-chemical characteristics of the barrier stack, especially the density, the stoichiometry and the chemical composition, by modifying parameters such as the pressure in the deposition chamber, the power and the nature or quantity of reactive gas.

Deposition techniques other than magnetron sputtering are also contemplated for depositing the layers of the barrier stack, in particular chemical vapor deposition (CVD), especially plasma-enhanced chemical vapor deposition (PECVD), atomic layer deposition (ALD) and evaporation techniques.

It should be noted that the layers of the multilayer stack are not necessarily deposited on the polymer layer. Thus, as an example, in the case of the devices shown in FIGS. 1 and 2 that are fabricated in superstrate mode, the thin films of the barrier stack are deposited in succession on the polymer substrate 1, whereas in the case of the devices shown in FIGS. 6 and 7 which are fabricated in substrate mode, the thin films of the barrier stack are deposited in succession on the electrode 315, the polymer lamination interlayer being added to the barrier stack in a subsequent step.

The invention claimed is:

1. A multilayer component comprising
   an organic polymer layer; and
   at least one barrier stack; wherein the barrier stack consists of three successive layers having alternately lower and higher degrees of crystallinity, the ratio of the degree of crystallinity of a layer of higher degree of crystallinity to the degree of crystallinity of a layer of lower degree of crystallinity being greater than or equal to 1.1,
   wherein the barrier stack comprises at least two layers in an amorphous state, and
   wherein the three successive layers are alternately in an amorphous state and in an at least partially crystalline state.

2. The multilayer component as claimed in claim 1, wherein the polymer layer and each barrier stack have a transparency of at least 75%.

3. The multilayer component as claimed in claim 1, wherein at least one layer of the barrier stack has a geometric thickness of no greater than 200 nm.

4. The multilayer component as claimed in claim 1, wherein the constituent layers of the barrier stack have alternately lower and higher refractive indices.

5. The multilayer component according to claim 1, wherein the organic polymer is selected from the group consisting of polyethylene terephthalate (PET), polyethylene naphthalate (PEN), polycarbonate, polyurethane, polymethyl methacrylate, polyamide, polyimide, and a fluoropolymer.

6. The multilayer component according to claim 5, wherein the organic polymer consists essentially of polyethylene terephthalate (PET) or polyethylene naphthalate (PEN).

7. The multilayer component according to claim 5, wherein the fluoropolymer is selected from the group consisting of ethylene-tetrafluoroethylene (ETFE), polyvinylidene fluoride (PVDF), polychlorotrifluoroethylene (PCTFE), ethylene-chlorotrifluoroethylene (ECTFE), and fluorinated ethylene-propylene copolymers (FEP).

8. The multilayer component according to claim 1, wherein the layers of the at least one barrier stack comprise a metal, a metal oxide, a metal nitride, a metal oxynitride, or a combination thereof.

9. The multilayer component according to claim 8, wherein the metal is selected from the group consisting of Si, Al, Sn, Zn, Zr, Ti, Hf, Bi, Ta, and alloys thereof.

10. The multilayer component according to claim 8, wherein the metal oxide, the metal nitride, or the metal oxynitride include an oxide, a nitride, or an oxynitride from the group consisting of Si, Al, Sn, Zn, Zr, Ti, Hf, Bi, Ta, and alloys thereof.

11. The multilayer component as claimed in claim 1, wherein the ratio of the degree of crystallinity of a layer of higher degree of crystallinity to the degree of crystallinity of a layer of lower degree of crystallinity is equal to or greater than 1.5.

12. The multilayer component as claimed in claim 1, wherein each layer of the at least one barrier stack comprises a volume degree of crystallinity, wherein a difference between the volume degree of crystallinity of a layer of higher degree of crystallinity and the volume degree of crystallinity of a layer of lower degree of crystallinity is equal to or greater than 10%.

13. A device comprising an element sensitive to air and/or moisture,
   which includes a multilayer component, an organic polymer layer; and at least one barrier stack, wherein the barrier stack consists of three successive layers having alternately lower and higher degrees of crystallinity, the ratio of the degree of crystallinity of a layer of higher degree of crystallinity to the degree of crystallinity of a layer of lower degree of crystallinity being greater than or equal to 1.1,
   wherein the barrier stack comprises at least two layers in an amorphous state, and
   wherein the three successive layers are alternately in an amorphous state and in an at least partially crystalline state.

14. The device as claimed in claim 13 wherein the sensitive element is an organic light-emitting diode, a photovoltaic cell, an electrochromic system, an electronic-ink display system, or of an inorganic light-emitting system.

15. A method of fabricating a multilayer component, the method comprising:
   providing an organic polymer layer;
   depositing a polyacrylate interfacial layer on the organic polymer layer;
   depositing a first layer onto the organic interfacial layer, the first layer having a first degree of crystallinity;
   depositing a second layer onto the first layer, the second layer having a second degree of crystallinity different from the first degree of crystallinity;
   depositing a third layer onto the second layer, the third layer having a third degree of crystallinity different from the second degree of crystallinity;
   wherein the first layer, the second layer, and the third layer form a barrier stack, wherein the barrier stack consists of three successive layers having alternately lower and higher degrees of crystallinity, the ratio of the degree of crystallinity of a layer of higher degree of crystallinity to the degree of crystallinity of a layer of lower degree of crystallinity being greater than or equal to 1.1,
   wherein the barrier stack comprises at least two layers in an amorphous state, and
   wherein the three successive layers are alternately in an amorphous state and in an at least partially crystalline state.

16. The method according to claim 15, wherein the depositing of the first, the second, or the third layer is selected from sputtering or depositing by chemical vapor deposition.

17. The method according to claim 15, wherein the chemical vapor deposition is selected from plasma-enhanced chemical vapor deposition, atomic layer deposition, or a combination thereof.

* * * * *